United States Patent
Tsai (10) Patent No.: US 9,842,831 B2
(45) Date of Patent: Dec. 12, 2017

(54) SEMICONDUCTOR PACKAGE AND FABRICATION METHOD THEREOF

(71) Applicant: MEDIATEK INC., Hsin-Chu (TW)

(72) Inventor: Shiann-Tsong Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/063,433

(22) Filed: Mar. 7, 2016

(65) Prior Publication Data

US 2016/0336303 A1    Nov. 17, 2016

Related U.S. Application Data

(60) Provisional application No. 62/161,591, filed on May 14, 2015, provisional application No. 62/190,401, filed on Jul. 9, 2015.

(51) Int. Cl.
*H01L 23/48*    (2006.01)
*H01L 25/16*    (2006.01)
(Continued)

(52) U.S. Cl.
CPC .......... *H01L 25/16* (2013.01); *H01L 21/4832* (2013.01); *H01L 21/563* (2013.01); *H01L 23/293* (2013.01); *H01L 24/03* (2013.01); *H01L 24/06* (2013.01); *H01L 24/14* (2013.01); *H01L 24/43* (2013.01); *H01L 24/46* (2013.01); *H01L 24/82* (2013.01); *H01L 24/96* (2013.01); *H01L 25/0657* (2013.01); *H01L 21/568* (2013.01);
(Continued)

(58) Field of Classification Search
CPC .......... H01L 24/82; H01L 24/96; H01L 24/46; H01L 24/43; H01L 24/14; H01L 24/03; H01L 25/50; H01L 25/16; H01L 25/0657
See application file for complete search history.

(56) References Cited

U.S. PATENT DOCUMENTS

| 8,026,589 B1 | 9/2011 | Kim |
| 2004/0140549 A1 | 7/2004 | Miyagawa |

(Continued)

FOREIGN PATENT DOCUMENTS

| JP | H05299530 A | 11/1993 |
| JP | 2001230270 A | 8/2001 |

(Continued)

OTHER PUBLICATIONS

Tsai et al., Title: Semiconductor Chip Package and Fabrication Method Thereof, pending U.S. Appl. No. 15/701,456, filed Sep. 12, 2017.

*Primary Examiner* — Trung Q Dang
(74) *Attorney, Agent, or Firm* — Winston Hsu (57) ABSTRACT

A semiconductor package includes a semiconductor die having an active surface and a bottom surface opposite to the active surface; a plurality of bond pads distributed on the active surface of the semiconductor die; an encapsulant covering the active surface of the semiconductor die, wherein the encapsulant comprises a bottom surface that is flush with the bottom surface of the semiconductor; and a plurality of printed interconnect features embedded in the encapsulant for electrically connecting the plurality of bond pads. Each of the printed interconnect features comprises a conductive wire and a conductive pad being integral with the conductive wire.

15 Claims, 13 Drawing Sheets

(51) Int. Cl.
*H01L 21/48* (2006.01)
*H01L 23/00* (2006.01)
*H01L 23/29* (2006.01)
*H01L 25/065* (2006.01)
*H01L 23/495* (2006.01)
*H01L 21/56* (2006.01)
*H01L 25/00* (2006.01)

(52) U.S. Cl.
CPC .......... *H01L 23/4952* (2013.01); *H01L 25/50* (2013.01); *H01L 2224/04042* (2013.01); *H01L 2225/0651* (2013.01); *H01L 2225/06562* (2013.01); *H01L 2225/1035* (2013.01); *H01L 2225/1058* (2013.01); *H01L 2924/00014* (2013.01); *H01L 2924/01006* (2013.01); *H01L 2924/01029* (2013.01); *H01L 2924/01047* (2013.01); *H01L 2924/01079* (2013.01); *H01L 2924/15311* (2013.01); *H01L 2924/18162* (2013.01); *H01L 2924/18165* (2013.01)

(56) References Cited

U.S. PATENT DOCUMENTS

| | | |
|---|---|---|
| 2005/0214980 A1 | 9/2005 | Shiu |
| 2007/0216033 A1 | 9/2007 | Corisis |
| 2009/0102067 A1* | 4/2009 | Wyland ............... H01L 23/3128 257/784 |
| 2010/0078824 A1 | 4/2010 | Okamori |
| 2011/0068481 A1* | 3/2011 | Park .................... H01L 23/3128 257/777 |
| 2011/0281138 A1* | 11/2011 | Yoshioka ............... H01L 24/24 428/815 |
| 2014/0319567 A1* | 10/2014 | Yoneda ................. H01L 24/19 257/98 |
| 2017/0077035 A1* | 3/2017 | Tao ................... H01L 23/49816 |

FOREIGN PATENT DOCUMENTS

| | | |
|---|---|---|
| JP | 2007123595 A | 5/2007 |
| TW | 481901 | 4/2002 |
| TW | 201133655 A1 | 10/2011 |

\* cited by examiner

SEMICONDUCTOR PACKAGE AND FABRICATION METHOD THEREOF

CROSS REFERENCE TO RELATED APPLICATIONS

This application claims the priority from U.S. provisional application No. 62/161,591 filed May 14, 2015 and U.S. provisional application No. 62/190,401 filed Jul. 9, 2015.

BACKGROUND

The present invention relates to interconnects of integrated circuits and semiconductor packages.

An integrated circuit (IC) die is a small device formed on a semiconductor wafer, such as a silicon wafer. Such a die is typically cut from the wafer and attached to a substrate for interconnect redistribution. Bond pads on the die are then electrically connected to the leads on the carrier via wire bonding. The die and wire bonds are then encapsulated with a molding compound such that a package is formed.

Typically, the leads encapsulated in the package are redistributed in a network of conductors within the carrier and end in an array of terminal points outside the package. Manufacturers have been stacking two or more die within a single package. Such devices are sometimes referred to as stacked multichip packages.

Figure 1:
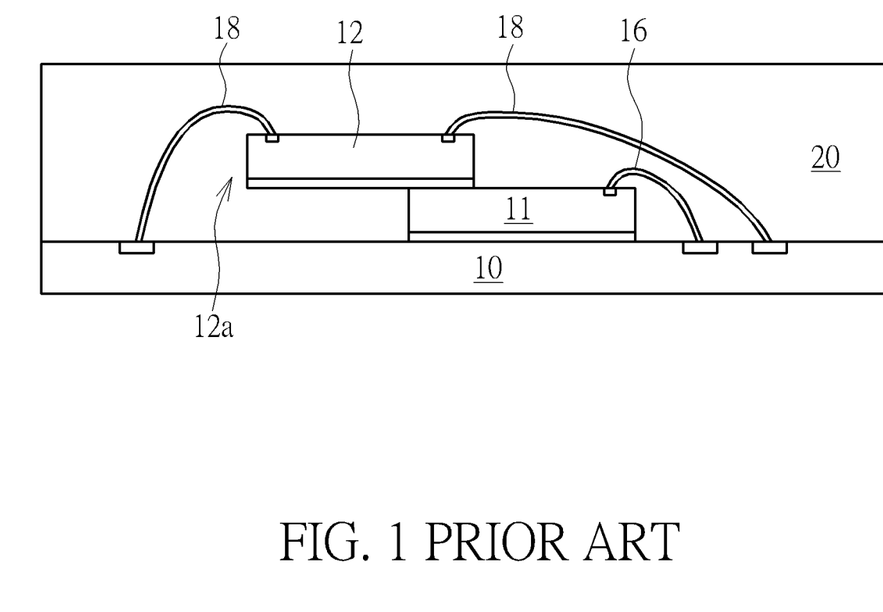
FIG. 1 is a schematic, cross-sectional diagram showing a conventional stacked multichip package.

One stacked multichip package is generally illustrated in FIG. 1. In this configuration a first die 11 is mounted on a substrate 10. A second die 12 may then be adhesively secured to the top surface of the first die 11 thereby creating a stacked die configuration. The second die 12 partially overlaps with the first die 11 when viewed from the above. Bonding wires 16 and 18 are then used to electrically connect the first die 11 and the second die 12 to the respective bond fingers on the substrate 10 using conventional wire bonder. An encapsulant material 20 is molded over the substrate 10 to provide an encapsulant cap.

However, it is difficult to form the wire bond 18 on the bond pads of the second die 12 adjacent to the overhanging side edge 12a. The stress incurred by the wire bonder may cause peeling between the first die 11 and the second die 12 and reduce the production yield.

SUMMARY

It is one objective of the claimed invention to provide an improved semiconductor package and a fabrication method thereof in order to solve the above-mentioned prior art problems.

According to one aspect of the invention, a semiconductor package includes a first semiconductor die having an active surface and a bottom surface opposite to the active surface; a plurality of bond pads distributed on the active surface of the first semiconductor die; an encapsulant covering the active surface of the first semiconductor die, wherein the encapsulant comprises a bottom surface that is flush with the bottom surface of the semiconductor; and a plurality of printed interconnect features embedded in the encapsulant for electrically connecting the plurality of bond pads. Each of the printed interconnect features comprises a conductive wire and a conductive pad being integral with the conductive wire.

According to one embodiment, the conductive pad is disposed around the first semiconductor die on the bottom surface of the encapsulant. The conductive pad has an exposed bottom surface that is flush with the bottom surface of the encapsulant.

According to one embodiment, the conductive wire and the conductive pad are integrally formed by using a three-dimensional (3D) printer. The printed interconnect features comprise silver, gold, copper, carbon nanotube, graphine, or nano metal particles.

According to another embodiment, the semiconductor package further includes a second semiconductor die adhesively secured to the top surface of the first semiconductor die. The second semiconductor die partially overlaps with the first semiconductor die when viewed from the above.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Figure 2:
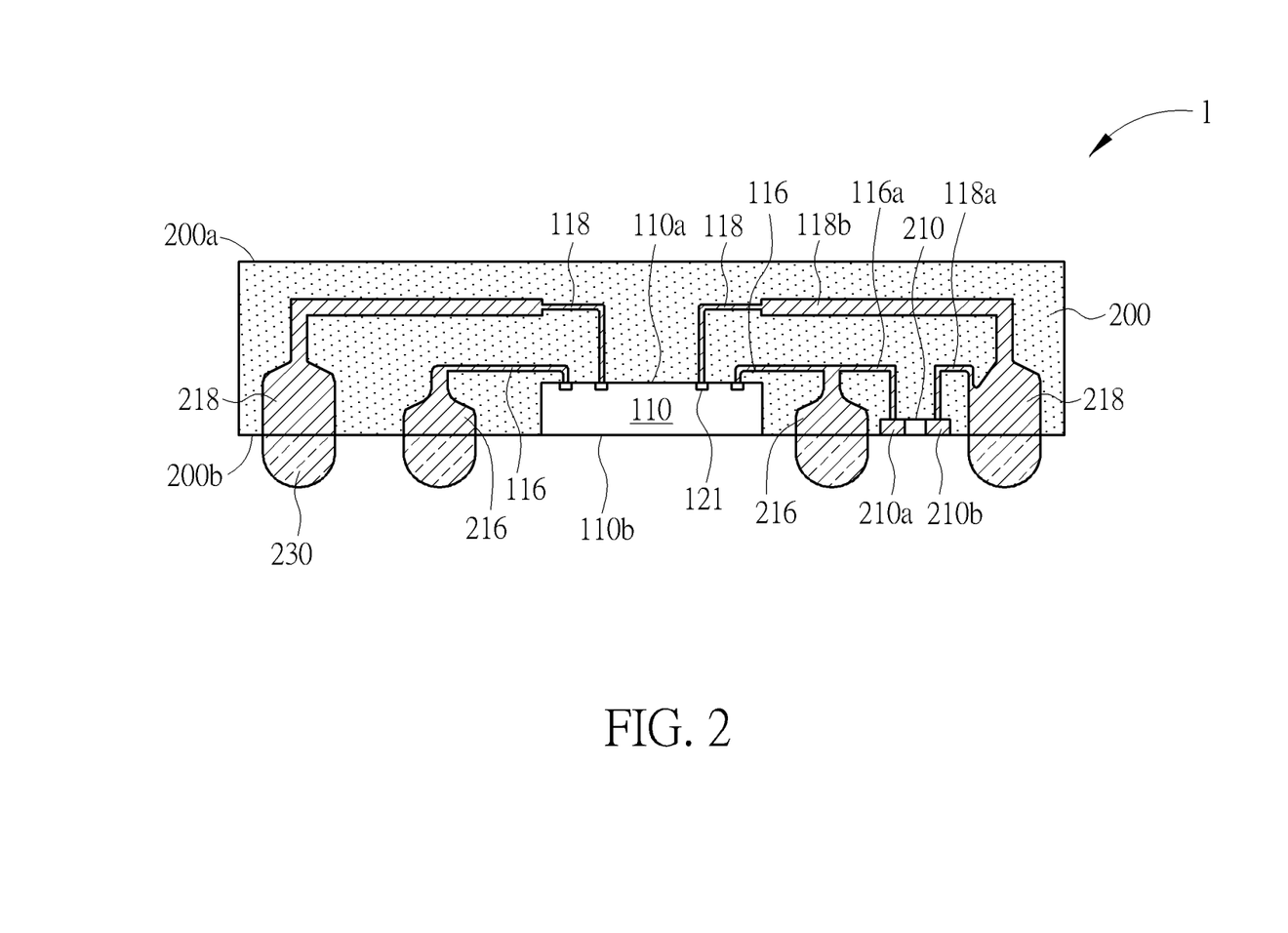
FIG. 2 is a schematic, cross-sectional diagram showing an exemplary semiconductor package in accordance with one embodiment of the invention.

Please refer to FIG. 2. FIG. 2 is a schematic, cross-sectional diagram showing an exemplary semiconductor package in accordance with one embodiment of the invention. As shown in FIG. 2, semiconductor package 1 comprises a semiconductor die 110. The semiconductor die 110 has a top surface or active surface 110a and a bottom surface 110b that is opposite to the active surface 110a. A plurality of bond pads or input/output (I/O) pads 121 are distributed on the active surface 110a. According to the embodiment of the invention, the active surface 110a, the I/O pads 121, and four side surfaces between the active surface 110a and the bottom surface 110b are covered with an encapsulant 200 such as a molding compound.

In some embodiments, the encapsulant 200 may be formed of an epoxy, a resin, a moldable polymer, or the like. The encapsulant 200 may be applied while substantially liquid, and then may be cured through a chemical reaction, such as in an epoxy or resin. In some other embodiments, the molding compound may be an ultraviolet (UV) or thermally cured polymer applied as a gel or malleable solid capable of being disposed around the semiconductor die 110, and then may be cured through a UV or thermal curing process. The encapsulant 200 may be cured with a mold (not shown).

According to the embodiment of the invention, the bottom surface 110b is exposed from a bottom surface 200b of the encapsulant 200. The encapsulant 200 has a top surface 200a that is opposite to the bottom surface 200b. According to the embodiment of the invention, the exposed bottom surface 110b of the semiconductor die 110 is flush with the bottom surface 200b of the encapsulant 200. According to the embodiment of the invention, no re-distribution layer (RDL) is required on the active surface 110a of the semiconductor die 110.

For the sake of simplicity, the structural details within the semiconductor die 110 are not shown in this figure. It is understood that the semiconductor die 110 may comprise a semiconductor substrate such as a silicon substrate. On the main surface of the semiconductor substrate, a plurality of circuit elements such as transistors may be formed. A plurality of inter-layer dielectric (ILD) layers may be deposited on the semiconductor substrate. The ILD layer may be formed of organic materials, which include a polymer base material, non-organic materials, which include silicon nitride ($SiN_x$), silicon oxide ($SiO_x$), graphene, or the like. A plurality of metal interconnection layers may be formed within the ILD layers. The I/O pads 121 of the semiconductor die 110 may be formed in the topmost metal layer covered with a passivation layer, but not limited thereto.

A plurality of conductive pads 216 and 218 are distributed on the bottom surface 200b of the encapsulant 200. The conductive pads 216 and 218 are arranged around the semiconductor die 110 and are electrically connected to the I/O pads 121 on the active surface 110a through the conductive wires 116 and 118 respectively. A plurality of connecting elements 230 such as conductive bumps (e.g. C4 bumps or copper pillars) or conductive balls (e.g. BGA balls) maybe formed on the conductive pads 216 and 218 for further connection.

It is one germane feature of the embodiment of the invention that the conductive wires 116 and 118 are integrally formed with the conductive pads 216 and 218. According to the embodiment of the invention, for example, the conductive wires 116 and 118 and the conductive pads 216 and 218 maybe formed by using a three-dimensional (3D) printer or a wire bonding tool having 3D printing function. The conductive wires 116 and 118 and the conductive pads 216 and 218 are encapsulated by the encapsulant 200. According to the embodiment of the invention, no packaging substrate or interposer is required. Further, since the conductive wires 116 and 118 are formed by using a 3D printer or a wire bonding tool having 3D printing function, the conductive wires 116 and 118 may comprise a portion that is bent at right angles, which may avoid shorting of the adjacent wires.

According to the embodiment of the invention, the semiconductor package 1 may further comprise a passive device 210 such as a discrete capacitor device, a resistor device, an inductor device, or the like. The passive device 210 may be disposed adjacent to the bottom surface 200b of the encapsulant 200. According to the embodiment of the invention, the passive device 210 may have two terminals 210a and 210b that are electrically connected to the conductive wire 116a and the conductive wire 118a, respectively.

According to the embodiment of the invention, the conductive wire 116a and the conductive wire 118a are integrally formed with the conductive wires 116 and 118, respectively. Therefore, the terminal 210a is electrically connected to the conductive pad 216 and the semiconductor die 110 through the integral conductive wires 116 and 116a, and the terminal 210b is electrically connected to the conductive pad 218 and the semiconductor die 110 through the integral conductive wires 118 and 118a.

According to the embodiment of the invention, the conductive wire 116 or 118 may have an integral portion with different patterns, diameters, or structural features formed along the lengthwise direction of the conductive wire 116 or 118. For example, FIG. 2 illustrates that the conductive wire 118 may have a widened portion 118b, which is disposed adjacent to the top surface 200a of the encapsulant 200. The widened portion 118b may comprise a pad, a plate, a grid, but not limited thereto.

Figure 3:
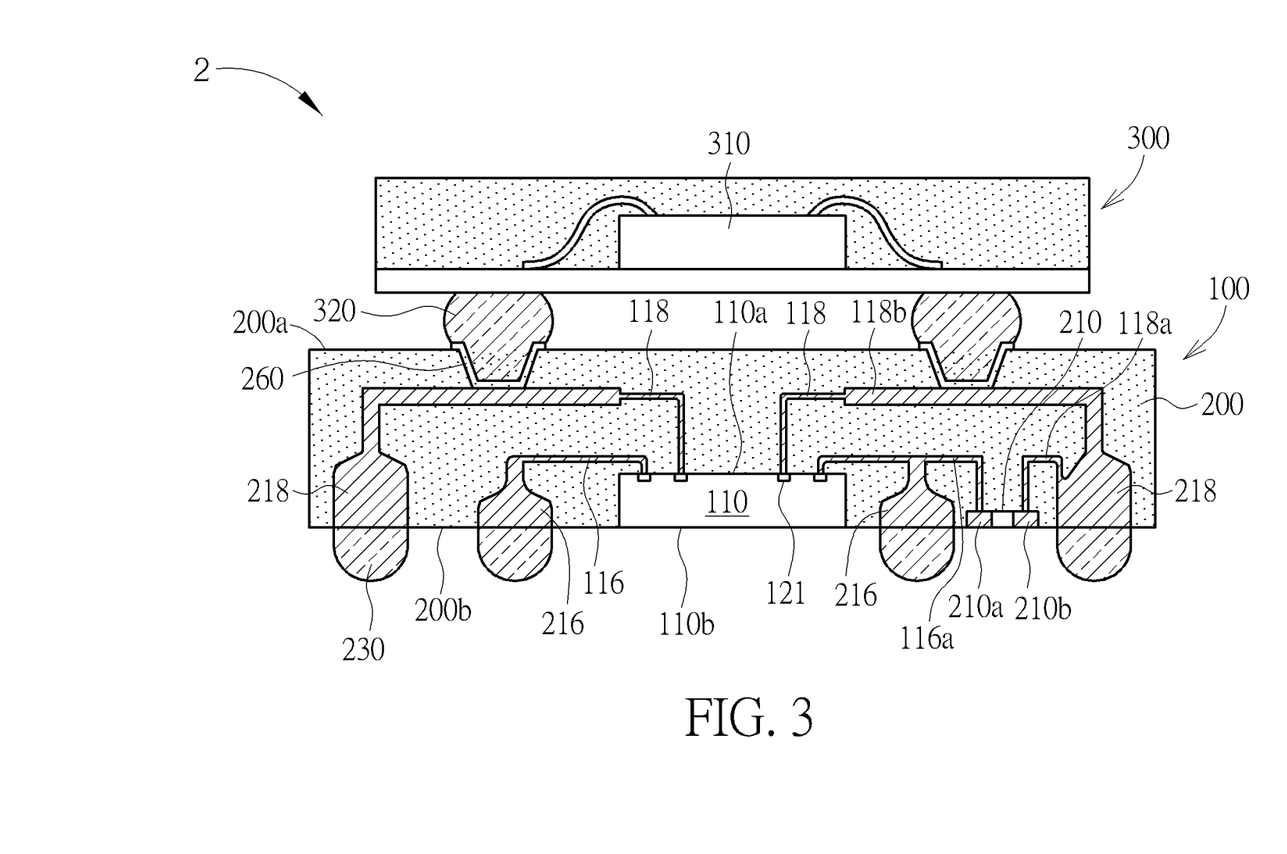
FIG. 3 is a schematic, cross-sectional diagram showing an exemplary package-on-package (PoP) in accordance with another embodiment of the invention.

Please refer to FIG. 3. FIG. 3 is a schematic, cross-sectional diagram showing an exemplary semiconductor package in accordance with another embodiment of the invention, wherein like numeral numbers designate like regions, layers, or elements. As shown in FIG. 3, the semiconductor package 2 may be a package-on-package (PoP). The semiconductor package 2 comprises a bottom die package 100 having the structural features as described in FIG. 2. The bottom die package 100 is different from the semiconductor package 1 of FIG. 2 in that openings 260 such as laser-drilled openings are formed in the top surface 200a of the encapsulant 200.

Each of the openings 260 may expose a portion of the integral portion 118b, which in this embodiment may function as an integral bond pad. Conductive elements 320 including, but not limited to, under bump metals and bumps are formed within the openings 260 and on the exposed integral portion 118b. A top die package 300 comprising a molded integrated circuit die 310 is mounted on the conductive elements 320.

Figure 4:
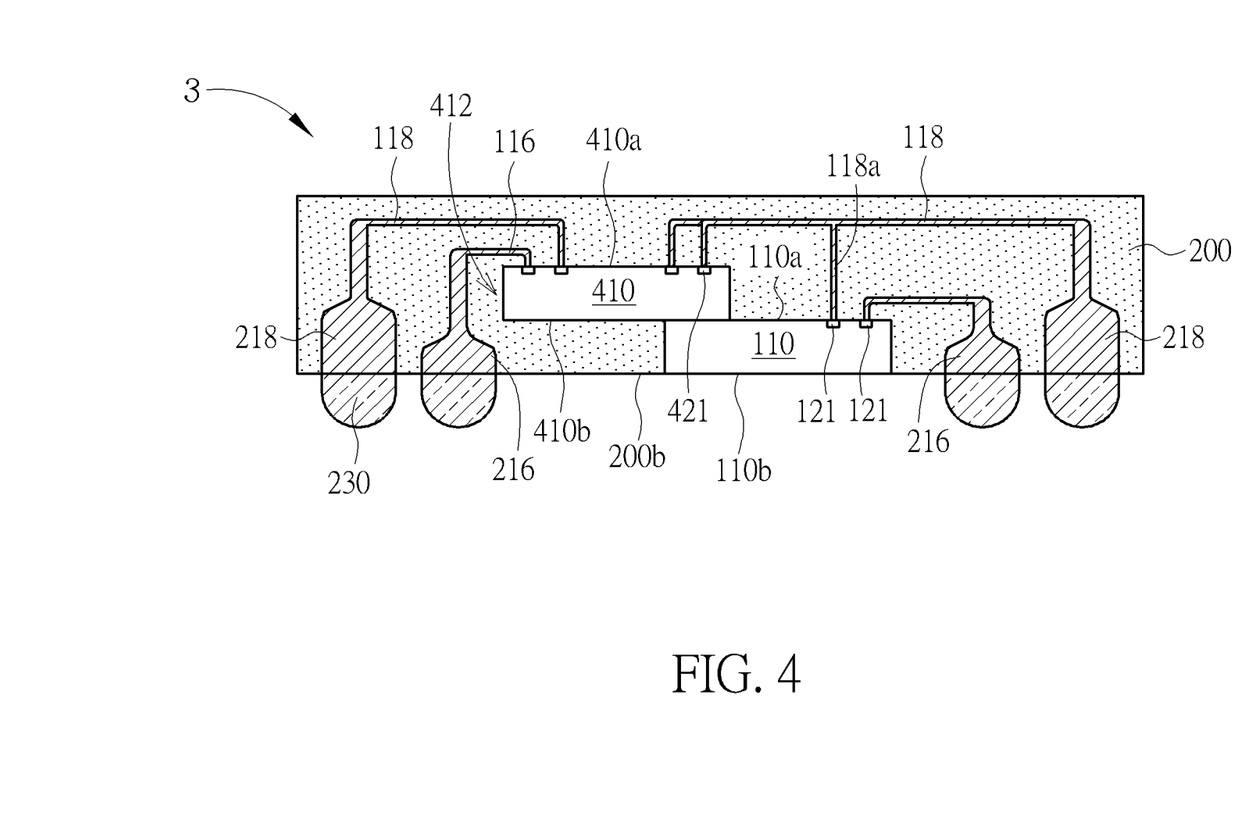
FIG. 4 is a schematic, cross-sectional diagram showing an exemplary multi-die package in accordance with still another embodiment of the invention.

Please refer to FIG. 4. FIG. 4 is a schematic, cross-sectional diagram showing an exemplary semiconductor package in accordance with still another embodiment of the invention, wherein like numeral numbers designate like regions, layers, or elements. As shown in FIG. 4, the semiconductor package 3 may be a multi-die package. The semiconductor package 3 may comprise a lower semiconductor die 110 and an upper semiconductor die 410 that is directly stacked on the lower semiconductor die 110. The upper semiconductor die 410 may be adhesively secured to the top surface of the lower semiconductor die 110. A plurality of bond pads or I/O pads 121 are distributed on an active surface 110a of the lower semiconductor die 110 and a plurality of bond pads or I/O pads 421 are distributed on an active surface 410a of the upper semiconductor die 410.

According to the embodiment of the invention, the upper semiconductor die 410 partially overlaps with the lower semiconductor die 110 when viewed from the above. Therefore, the upper semiconductor die 410 comprises an overhanging side edge 412. The overhanging side edge 412 and a bottom surface 410b beyond an edge of the lower semiconductor die 110 are encapsulated by the encapsulant 200.

Likewise, a plurality of conductive pads 216 and 218 may be distributed on the bottom surface 200b of the encapsulant 200. The conductive pads 216 and 218 may be arranged in an array around the semiconductor die 110 and may be electrically connected to the I/O pads 121 on the active surface 110a and I/O pads 421 on the active surface 410a through the conductive wires 116 and 118 respectively.

A plurality of connecting elements 230 such as conductive bumps (e.g. C4 bumps or copper pillars) or conductive balls (e.g. BGA balls) may be formed on the conductive pads 216 and 218 for further connection. According to the embodiment of the invention, at least an I/O pad 421 is interconnected to at least an I/O pad 121 through the conductive wire 118 and a branched conductive wire 118a, for example, which is integrally formed with the conductive wire 118.

Figure 5:
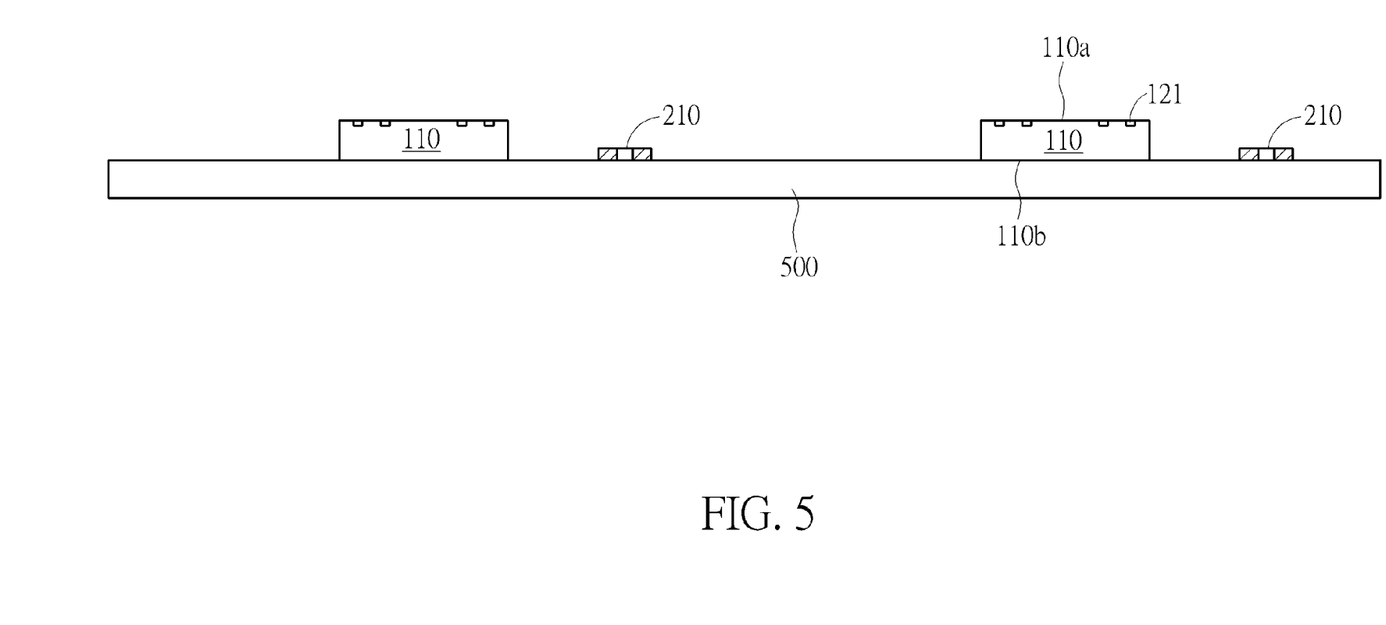
FIG. 5 to FIG. 9 are schematic, cross-sectional diagrams showing an exemplary method for fabricating the semiconductor package as set forth in FIG. 2 according to one embodiment of the invention.

FIG. 5 to FIG. 9 are schematic, cross-sectional diagrams showing an exemplary method for fabricating the semiconductor package 1 as set forth in FIG. 2 according to one embodiment of the invention. As shown in FIG. 5, first, a carrier 500 may be provided. The carrier 500 may comprise glass, silicon, metal, or any suitable materials. A plurality of semiconductor dice 110 is disposed on the carrier 500. Each of the semiconductor dice 110 has a top surface or active surface 110a and a bottom surface 110b that is opposite to the active surface 110a. A plurality of bond pads or I/O pads 121 are distributed on the active surface 110a.

The semiconductor dice 110 may be adhesively secured to the top surface of the carrier 500. Optionally, passive devices 210, such as a discrete capacitor device, a resistor device, an inductor device, or the like, may also be disposed on the carrier 500.

Figure 6:
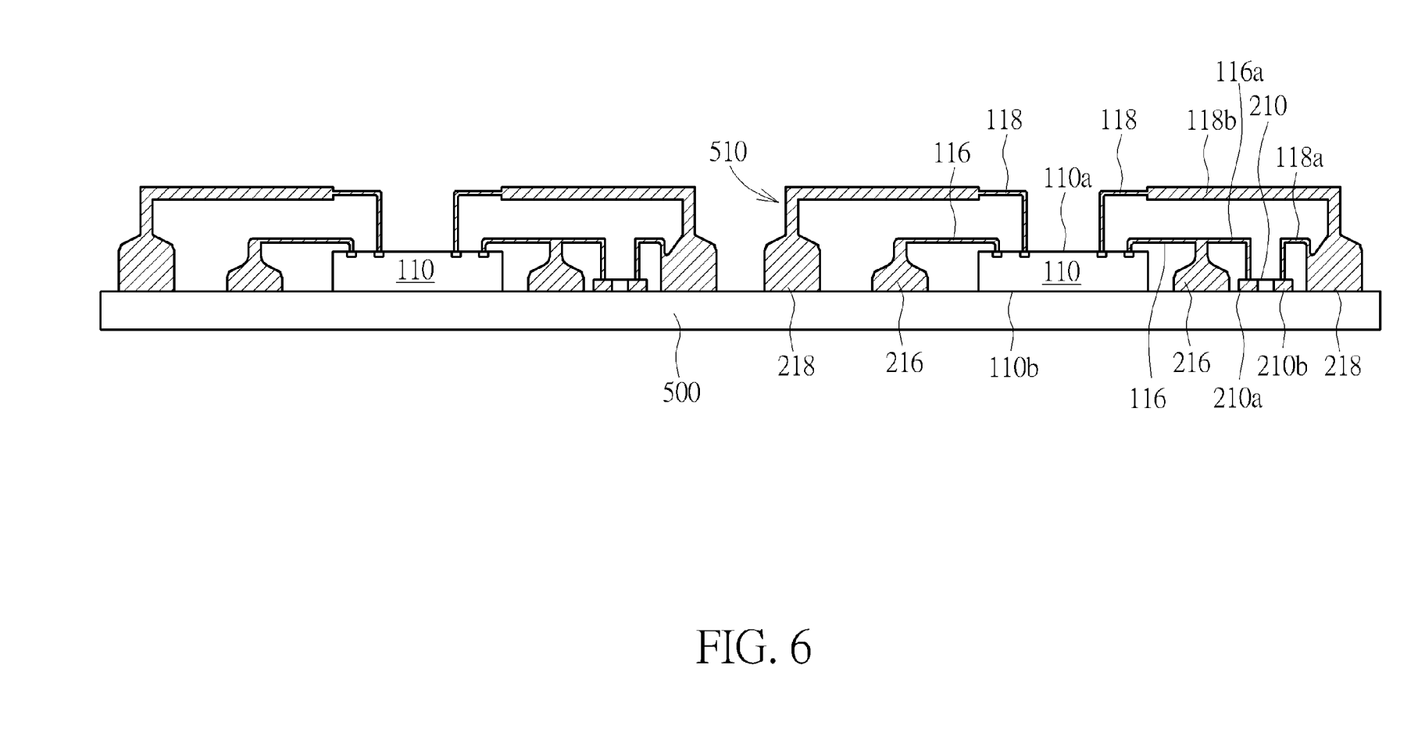

As shown in FIG. 6, interconnect features 510 including, but not limited to, conductive pads 216 and 218 and conductive wires 116 and 118, are formed on the carrier 500 and on the top surfaces 110a of the semiconductor dice 110. The conductive wires 116 and 118 are integrally formed with the conductive pads 216 and 218, respectively. The passive device 210 may have two terminals 210a and 210b that are electrically connected to the conductive wire 116a and the conductive wire 118a, respectively.

For example, the conductive wires 116 and 118 and the conductive pads 216 and 218 may be formed by using a 3D printer or a wire bonding tool having 3D printing function. For example, the interconnect features 510 may be composed of silver, gold, copper, carbon nanotube, graphine, or nano metal particles, but not limited thereto. After the formation of the interconnect features 510, optionally, a curing process or a drying process may be performed to cure the interconnect features 510 and/or remove solvent from the interconnect features 510.

According to the embodiment of the invention, for example, the conductive wire 118 may have an integral portion with different patterns, diameters, or structural features formed along its lengthwise direction. For example, the conductive wire 118 may have a widened portion 118b. The widened portion 118b may comprise a pad, a plate, a grid, but not limited thereto. It is understood that other features, for example, a heat pipe (not shown), may also be printed on the carrier 500 at this stage.

Figure 7:
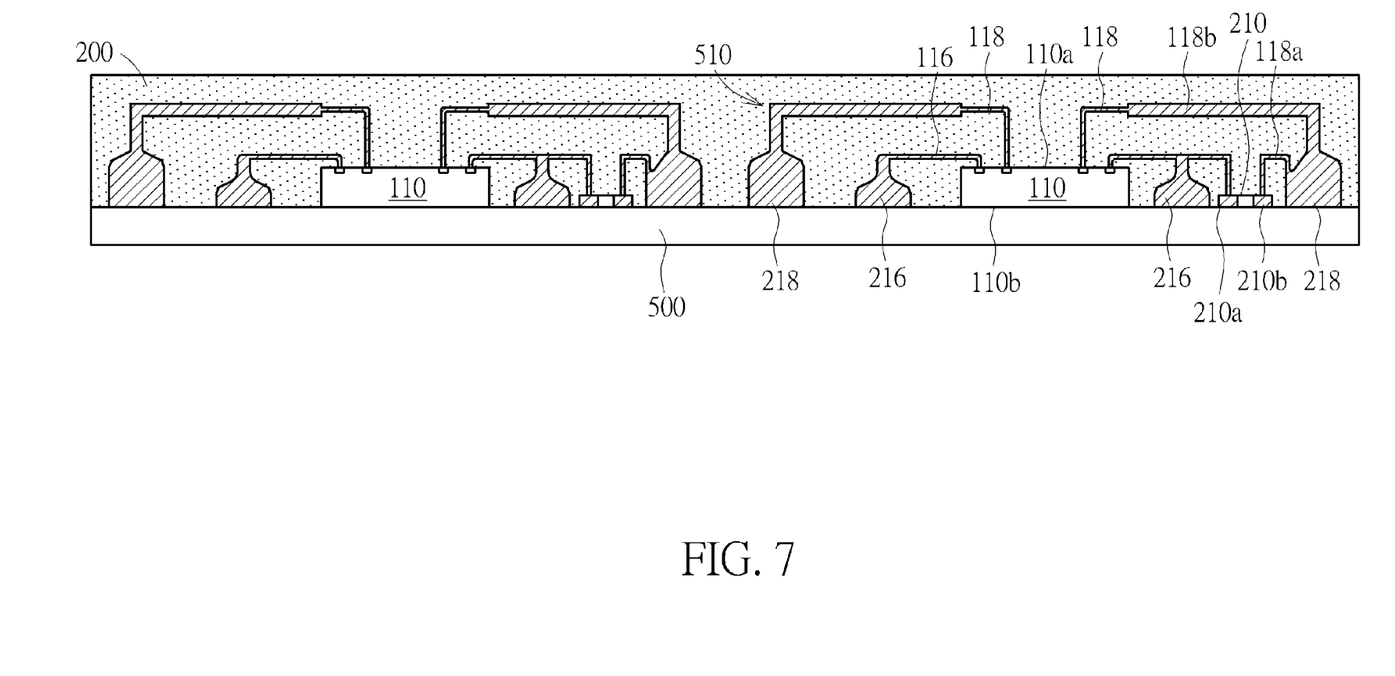

As shown in FIG. 7, subsequently, the top surface of the carrier 500, the top surfaces 110a of the semiconductor dice 110, the conductive wires 116 and 118, and the conductive pads 216 and 218 are encapsulated by the encapsulant 200. For example, the encapsulant 200 may comprise a molding compound including, but not limited to, an epoxy or resin.

Figure 8:
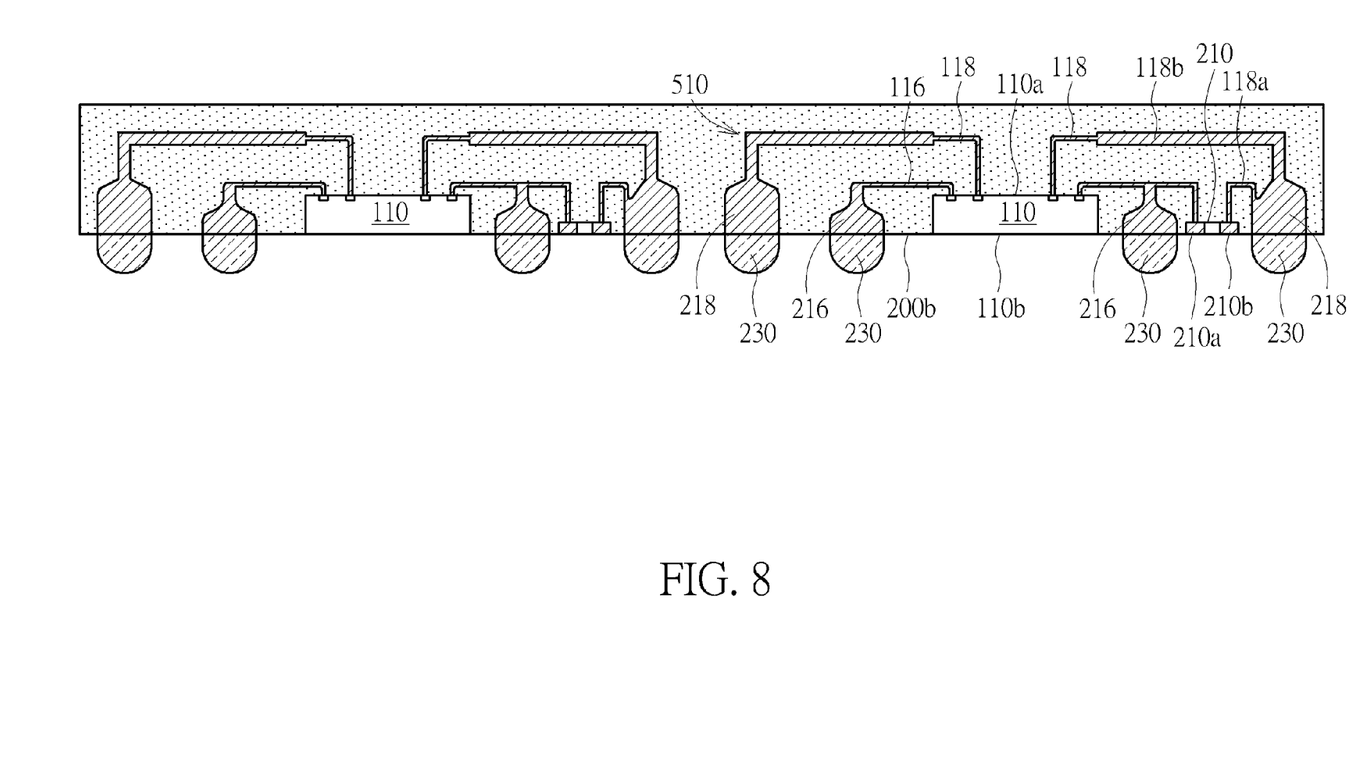

As shown in FIG. 8, the carrier 500 is then removed to expose the bottom surface 200b of the encapsulant 200, the bottom surfaces 110b of the semiconductor dice 110, and the conductive pads 216 and 218. A plurality of connecting elements 230 such as conductive bumps (e.g. C4 bumps or copper pillars) or conductive balls (e.g. BGA balls) maybe formed on the conductive pads 216 and 218 for further connection. Although not shown in this figure, it is understood that a passivation layer may be formed on the bottom surface 200b of the encapsulant 200 and bottom surfaces 110b of the semiconductor dice 110.

Figure 9:
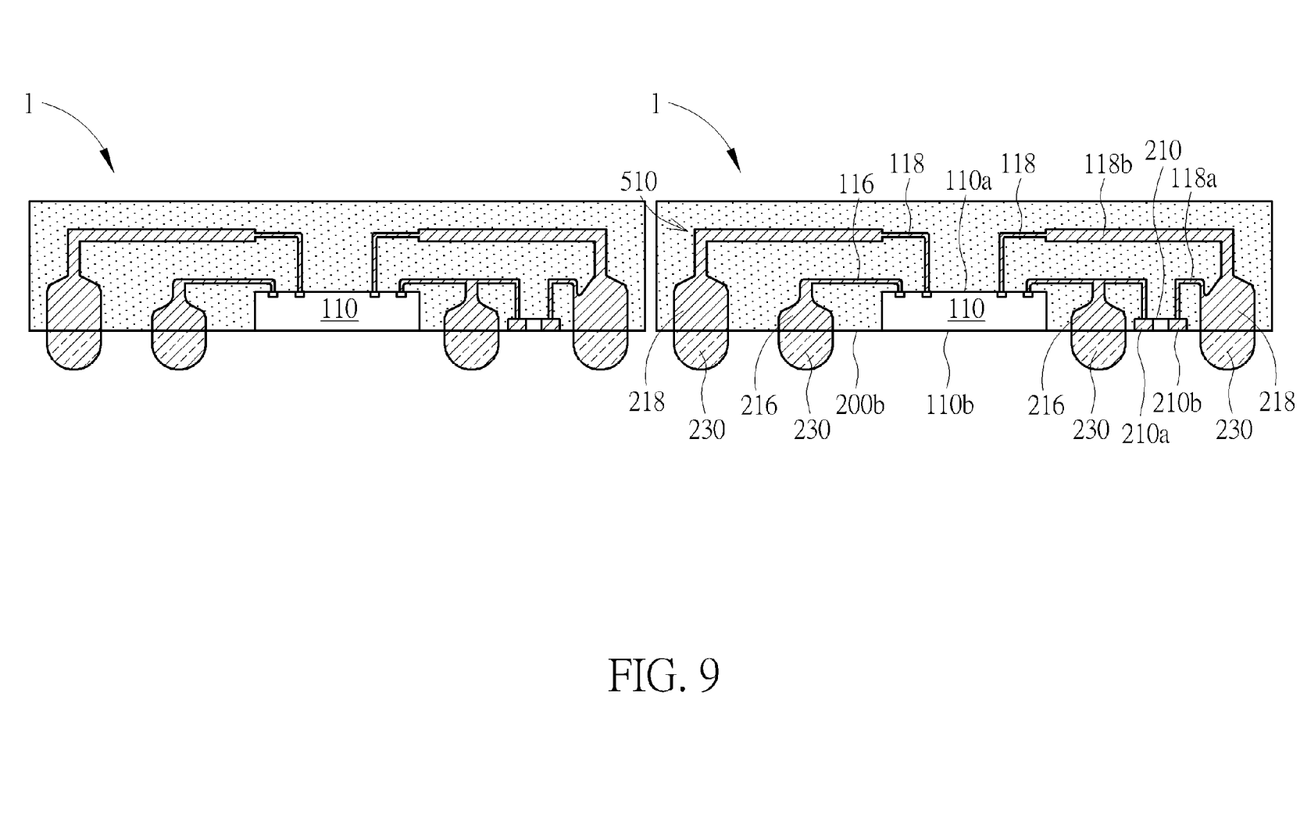

As shown in FIG. 9, after the formation of the connecting elements 230, a dicing process is performed to singulate individual semiconductor packages 1 from one another. During the aforesaid dicing process, a dicing tape (not shown) may be used to provide temporary support.

Figure 10:
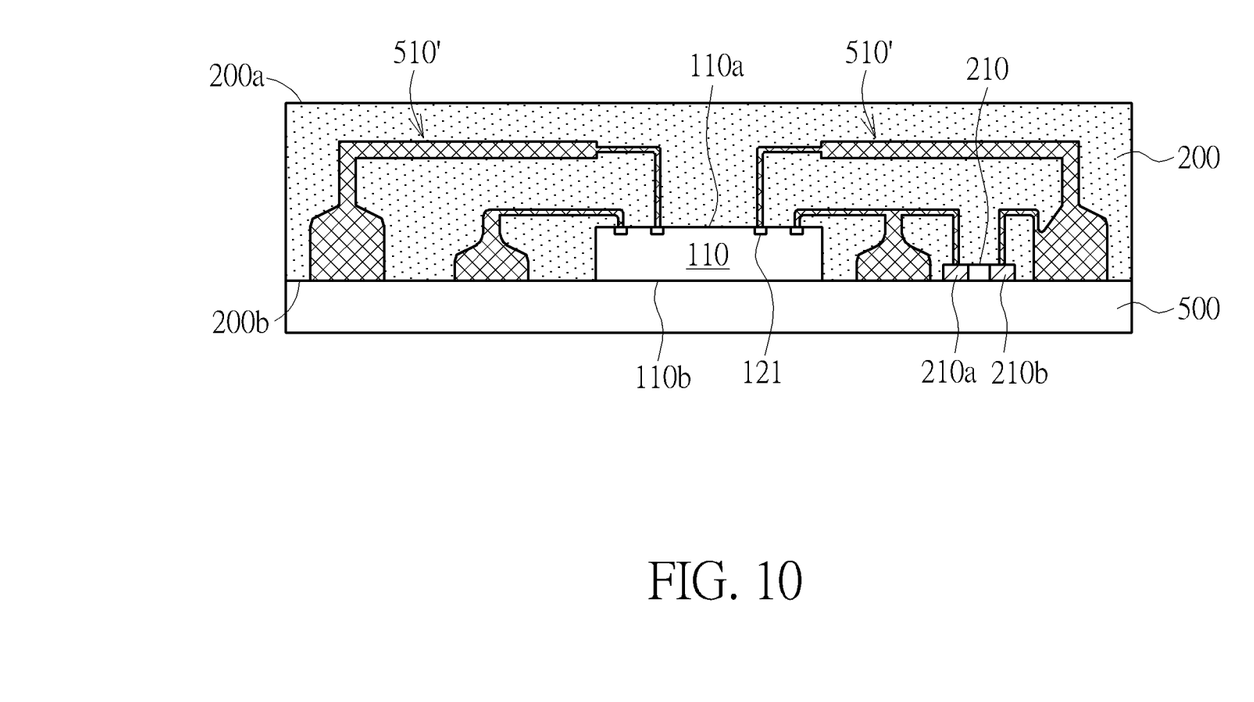
FIG. 10 to FIG. 12 are schematic, cross-sectional diagrams showing an exemplary method for fabricating the semiconductor package as set forth in FIG. 2 according to another embodiment of the invention.
Figure 11:
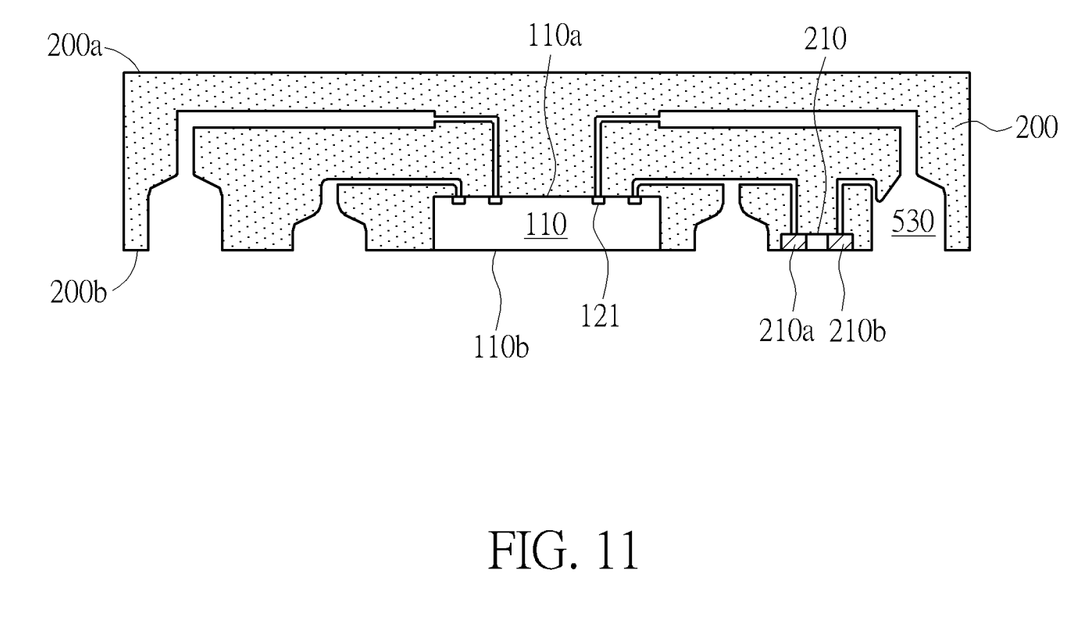
Figure 12:
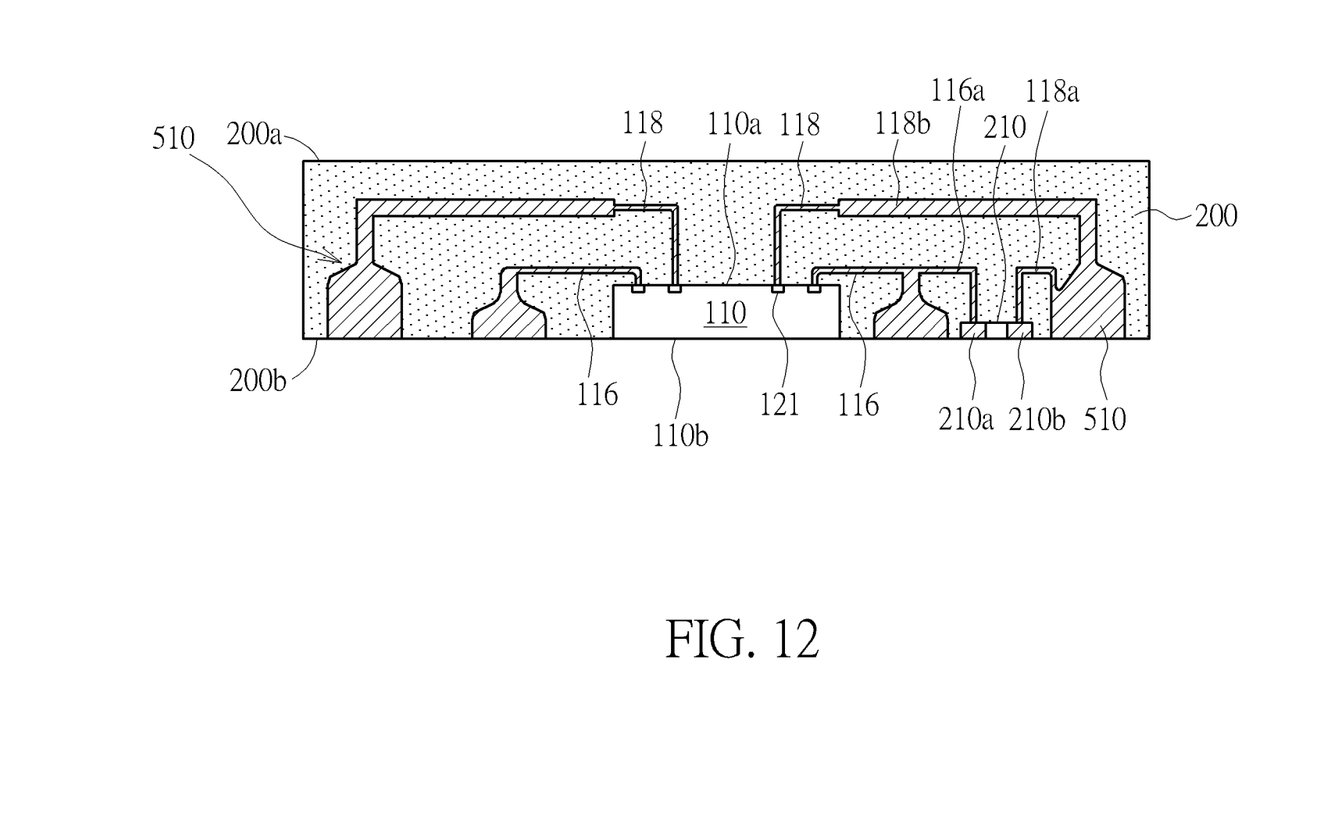

FIG. 10 to FIG. 12 are schematic, cross-sectional diagrams showing an exemplary method for fabricating the semiconductor package 1 according to another embodiment of the invention, wherein like numeral numbers designate like regions, layers, or elements.

As shown in FIG. 10, after mounting the semiconductor die 110 and the passive device 210 on the carrier 500, a temporary interconnect features 510' may be formed by using a 3D printer. According to the embodiment of the invention, the temporary interconnect features 510' may be composed of a non-conductive material or an ashable material. For the sake of simplicity, only one semiconductor die 110 on the carrier 500 is shown.

Subsequently, the top surface of the carrier 500, the top surface 110a of the semiconductor die 110, and the temporary interconnect features 510' are encapsulated by the encapsulant 200. For example, the encapsulant 200 may comprise an epoxy molding compound.

As shown in FIG. 11, the carrier 500 is then removed to expose the bottom surface 200b of the encapsulant 200, the bottom surfaces 110b of the semiconductor dice 110, and a portion of the temporary interconnect features 510'. Subsequently, the temporary interconnect features 510' is completely removed, thereby forming cavity 530 within the encapsulant 200.

As shown in FIG. 12, the cavity 530 is then filled up with conductive material to form interconnect features 510 including, but not limited to, conductive pads 216 and 218 and conductive wires 116 and 118. The conductive wires 116 and 118 are integrally formed with the conductive pads 216 and 218. The passive device 210 may have two terminals 210a and 210b that are electrically connected to the conductive wire 116a and the conductive wire 118a, respectively.

For example, the interconnect features 510 may be composed of silver, gold, copper, carbonnanotube, graphine, nanometal particles, or solder, but not limited thereto. After the formation of the interconnect features 510, optionally, a curing process, a reflow process, or a drying process may be performed.

Figure 13:
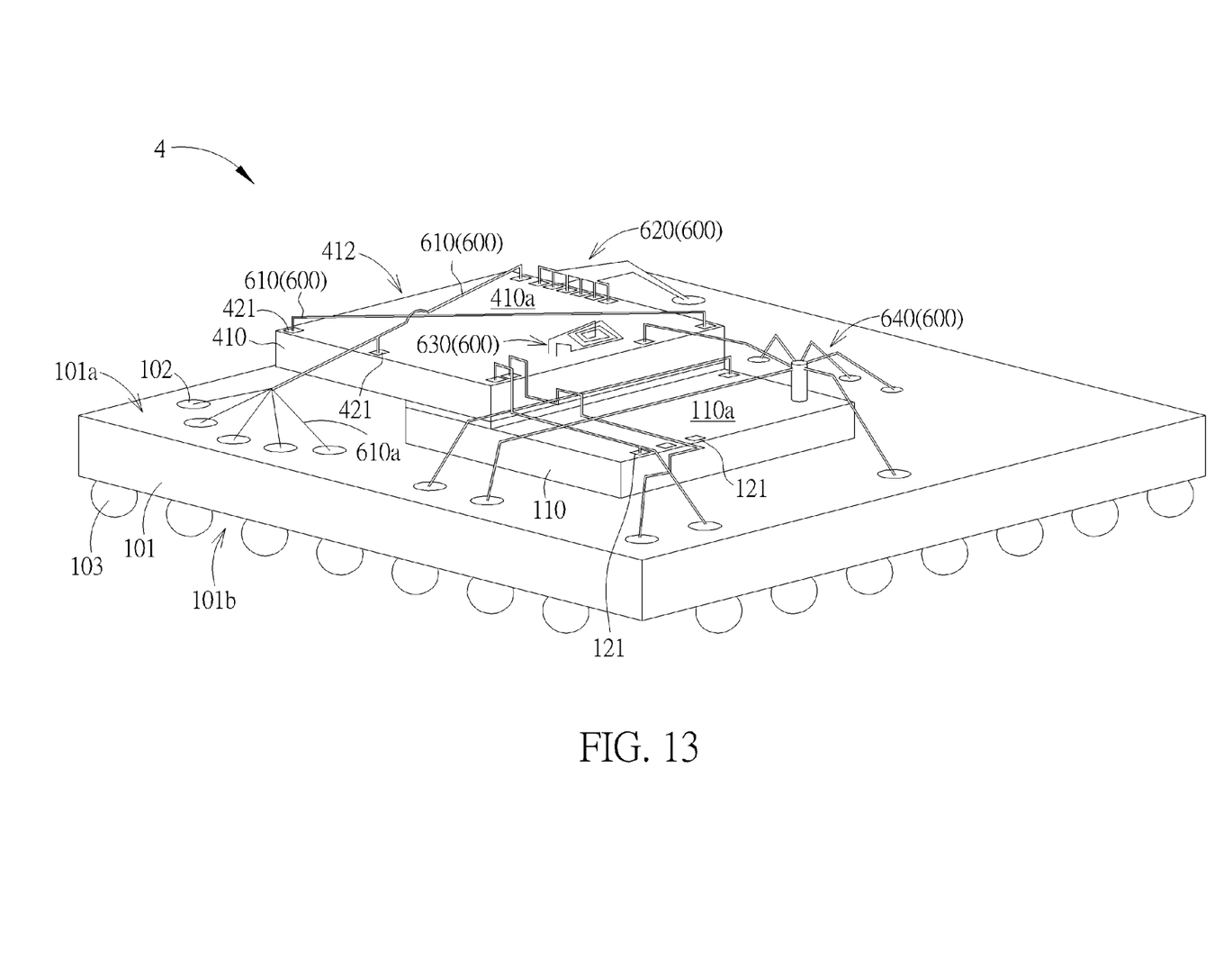
FIG. 13 is a schematic perspective diagram showing an exemplary semiconductor package in accordance with still another embodiment of the invention.

FIG. 13 is a schematic perspective diagram showing an exemplary semiconductor package in accordance with still another embodiment of the invention, wherein like numeral numbers designate like regions, layers, or elements. As shown in FIG. 13, the semiconductor package 4 maybe a multi-die package. The semiconductor package 4 may comprise a substrate 101 having a top surface 101a and a bottom surface 101b that is opposite to the top surface 101a. The substrate 101 may comprise a packaging substrate or a printed wiring board, but not limited thereto. A plurality of bond fingers 102 may be arranged on the top surface 101a of the substrate 101 along its perimeter. On the bottom surface 101b, a plurality of solder balls 103 may be arranged.

The semiconductor package 4 may comprise a lower semiconductor die 110 and an upper semiconductor die 410 that is directly stacked on the lower semiconductor die 110. The upper semiconductor die 410 may be adhesively secured to the top surface 110a of the lower semiconductor die 110. A plurality of bond pads or I/O pads 121 are distributed on an active surface 110a of the lower semiconductor die 110 and a plurality of bond pads or I/O pads 421 are distributed on an active surface 410a of the upper semiconductor die 410. According to the embodiment of the invention, the upper semiconductor die 410 partially overlaps with the lower semiconductor die 110 when viewed from the above. Therefore, the upper semiconductor die 410 comprises an overhanging side edge 412. The overhanging side edge 412 and a bottom surface 410b beyond an edge of the lower semiconductor die 110 may be encapsulated by the encapsulant (not shown).

According to the embodiment of the invention, 3D printed features 600 including, but not limited to, conductive wires 610, PMU (power management unit) heatpipe 620, inductor 630, and power bar 640, may be formed on the top surface 410a of the upper semiconductor die 410 and on the top surface 110a of the lower semiconductor die 110. According to the embodiment of the invention, the conductive wires 610 may interconnect the bond pads 421, the bond pads 121, and/or the bond fingers 102. For example, one conductive wire 610 may be electrically connected to multiple bond fingers 102 through the sub-wires 610a that is formed integrally with the conductive wire 610.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a first semiconductor die having an active surface and a bottom surface opposite to the active surface;
a plurality of input/output (I/O) pads distributed on the active surface of the first semiconductor die;
an encapsulant covering the active surface of the first semiconductor die, wherein the encapsulant comprises a bottom surface that is flush with the bottom surface of the first semiconductor; and
a plurality of printed interconnect features embedded in the encapsulant for electrically connecting the plurality of I/O pads, wherein each of the printed interconnect features comprises a conductive wire and a conductive pad being integral with the conductive wire, wherein the conductive wire comprises a widened portion disposed along a lengthwise direction of the conductive wire, and wherein the conductive wire and the widened portion extends along a first direction and the conductive pad is connected to the widened portion and extends along a second direction that is perpendicular to the first direction.

2. The semiconductor package according to claim 1, wherein the conductive pad is disposed around the first semiconductor die on the bottom surface of the encapsulant, and wherein the conductive pad has an exposed bottom surface that is flush with the bottom surface of the encapsulant.

3. The semiconductor package according to claim 1, wherein the conductive wire and the conductive pad are integrally formed by using a three-dimensional (3D) printer.

4. The semiconductor package according to claim 1, wherein the printed interconnect features comprise silver, gold, copper, carbon nanotube, graphene, or nano metal particles.

5. The semiconductor package according to claim 1, wherein the encapsulant comprises an epoxy, a resin, or a moldable polymer.

6. The semiconductor package according to claim 1, wherein the bottom surface of the first semiconductor die is not covered by the encapsulant.

7. The semiconductor package according to claim 1, wherein the widened portion is disposed adjacent to a top surface of the encapsulant.

8. The semiconductor package according to claim 7, wherein the widened portion comprises a pad.

9. The semiconductor package according to claim 8, wherein an opening is formed in the top surface of the encapsulant to expose the pad.

10. The semiconductor package according to claim 9, wherein a conductive element is disposed in the opening and on the pad.

11. The semiconductor package according to claim 10, wherein a die package is mounted on the top surface of the encapsulant and is electrically connected to the conductive element.

12. The semiconductor package according to claim 1 further comprising a passive device embedded in the encapsulant and electrically connected to the printed interconnect features.

13. The semiconductor package according to claim 1 further comprising a second semiconductor die adhesively secured to the top surface of the first semiconductor die.

14. The semiconductor package according to claim 13, wherein the second semiconductor die partially overlaps with the first semiconductor die when viewed from above.

15. A semiconductor package, comprising:
a semiconductor die having an active surface and a bottom surface opposite to the active surface;
a plurality of input/output (I/O) pads distributed on the active surface of the semiconductor die;
an encapsulant covering the active surface of the semiconductor die, wherein the encapsulant comprises a bottom surface that is flush with the bottom surface of the semiconductor die; and
a plurality of printed conductive wires embedded in the encapsulant for electrically connecting the plurality of I/O pads, wherein each of the printed conductive wires comprises a portion bent at right angles and is connected to a conductive pad disposed around the semiconductor die on the bottom surface of the encapsulant, and wherein the conductive pads has an exposed bottom surface that is flush with the bottom surface of the encapsulant.

* * * * *